(12) United States Patent
Torunoglu

(10) Patent No.: US 9,305,132 B1
(45) Date of Patent: *Apr. 5, 2016

(54) APPROXIMATE CALCULATION OF 2D MATRIX ENTRIES VIA GPU

(71) Applicant: D2S, Inc., San Jose, CA (US)

(72) Inventor: Ilhami H. Torunoglu, Monte Sereno, CA (US)

(73) Assignee: D2S, Inc., San Jose, CA (US)

( * ) Notice: Subject to any disclaimer, the term of this patent is extended or adjusted under 35 U.S.C. 154(b) by 353 days.

This patent is subject to a terminal disclaimer.

(21) Appl. No.: 13/933,899

(22) Filed: Jul. 2, 2013

Related U.S. Application Data

(63) Continuation of application No. 11/875,650, filed on Oct. 19, 2007, now Pat. No. 8,478,808.

(60) Provisional application No. 60/862,362, filed on Oct. 20, 2006.

(51) Int. Cl.
*G06F 17/10* (2006.01)
*G06F 17/50* (2006.01)
*G06F 17/16* (2006.01)

(52) U.S. Cl.
CPC ............ *G06F 17/5081* (2013.01); *G06F 17/16* (2013.01)

(58) Field of Classification Search
None
See application file for complete search history.

(56) References Cited

U.S. PATENT DOCUMENTS

| 5,757,954 A | 5/1998 | Kuan et al. |
| 6,513,054 B1 | 1/2003 | Carroll |
| 7,545,984 B1 | 6/2009 | Kiel et al. |
| 2004/0207642 A1 | 10/2004 | Crisu et al. |

*Primary Examiner* — Michael D Yaary
(74) *Attorney, Agent, or Firm* — The Mueller Law Office, P.C.

(57) ABSTRACT

Minimizing memory access by converting a given matrix computation into a set of low-order polynomials. The set of polynomials is processed using parallel computational hardware such as graphical processing units.

5 Claims, 3 Drawing Sheets

APPROXIMATE CALCULATION OF 2D MATRIX ENTRIES VIA GPU

CROSS-REFERENCE TO RELATED APPLICATION

This patent application is a continuation of U.S. patent application Ser. No. 11/875,650, filed Oct. 19, 2007, issued as U.S. Pat. No. 8,478,808 on Jul. 2, 2013, which claims the benefit of U.S. provisional patent application 60/862,362, filed Oct. 20, 2006, which are incorporated by reference along with all other references cited in this application.

BACKGROUND OF THE INVENTION

This invention relates to the field of scientific computation and in particular, to techniques of using parallel computational hardware such as graphical processing units in scientific computation.

In scientific computations, such as physics and image processing, two-dimensional (2D) matrix representations are commonly implemented as lookup tables (LUTs). The main motivation with such approach is to be able to calculate a finite set of values beforehand and store in the memory to avoid real-time computations.

With the above approach, the computational burden is replaced with increased communication with the memory. In the cases where these tables cannot fit into fast-speed memories such as L1 cache, the frequent access to these tables significantly slow down the computational speed.

Therefore an improved approach is needed.

BRIEF SUMMARY OF THE INVENTION

The invention is a technique of minimizing memory access by converting a given matrix computation into a set of low-order polynomials. The set of polynomials is processed using parallel computational hardware such as graphical processing units.

In an embodiment, the invention is a methodology to minimize the memory access by converting a given matrix computation into a set of low-order polynomials in parallel computational hardware including graphical processing units.

In an embodiment, the invention is a methodology to minimize the memory access by converting a given matrix computation into a set of low-order polynomials in lithography and signal processing related computations in parallel computation hardware such as graphical processing units.

In an embodiment, the invention is an iterative set of rules to reduce the given computations into the desired polynomial order for computational efficiency dictated by the computational hardware.

In an embodiment, the invention is a methodology to break down a matrix-based computation into a set of polynomials.

In an embodiment, the invention is a methodology to determine the requisite order of polynomials to achieve a given accuracy target.

In an embodiment, the invention is the convolution calculations required by lithography applications implemented in parallel computational hardware such as graphical processing units. The initial computational requirement may be split into two polynomials. The initial computational requirement may be split further into, for example, ten subpolynomials to optimize the memory access.

Other objects, features, and advantages of the present invention will become apparent upon consideration of the following detailed description and the accompanying drawings, in which like reference designations represent like features throughout the figures.

DETAILED DESCRIPTION OF THE INVENTION

U.S. patent application Ser. No. 11/566,140, filed Dec. 1, 2006; Ser. No. 11/566,146, filed Dec. 1, 2006; Ser. No. 11/864,296, filed Sep. 28, 2007; Ser. No. 11/864,343, filed Sep. 28, 2007; Ser. No. 11/864,381, filed Sep. 28, 2007; and Ser. No. 11/864,419, filed Sep. 28, 2007 are incorporated by reference.

Figure 1:
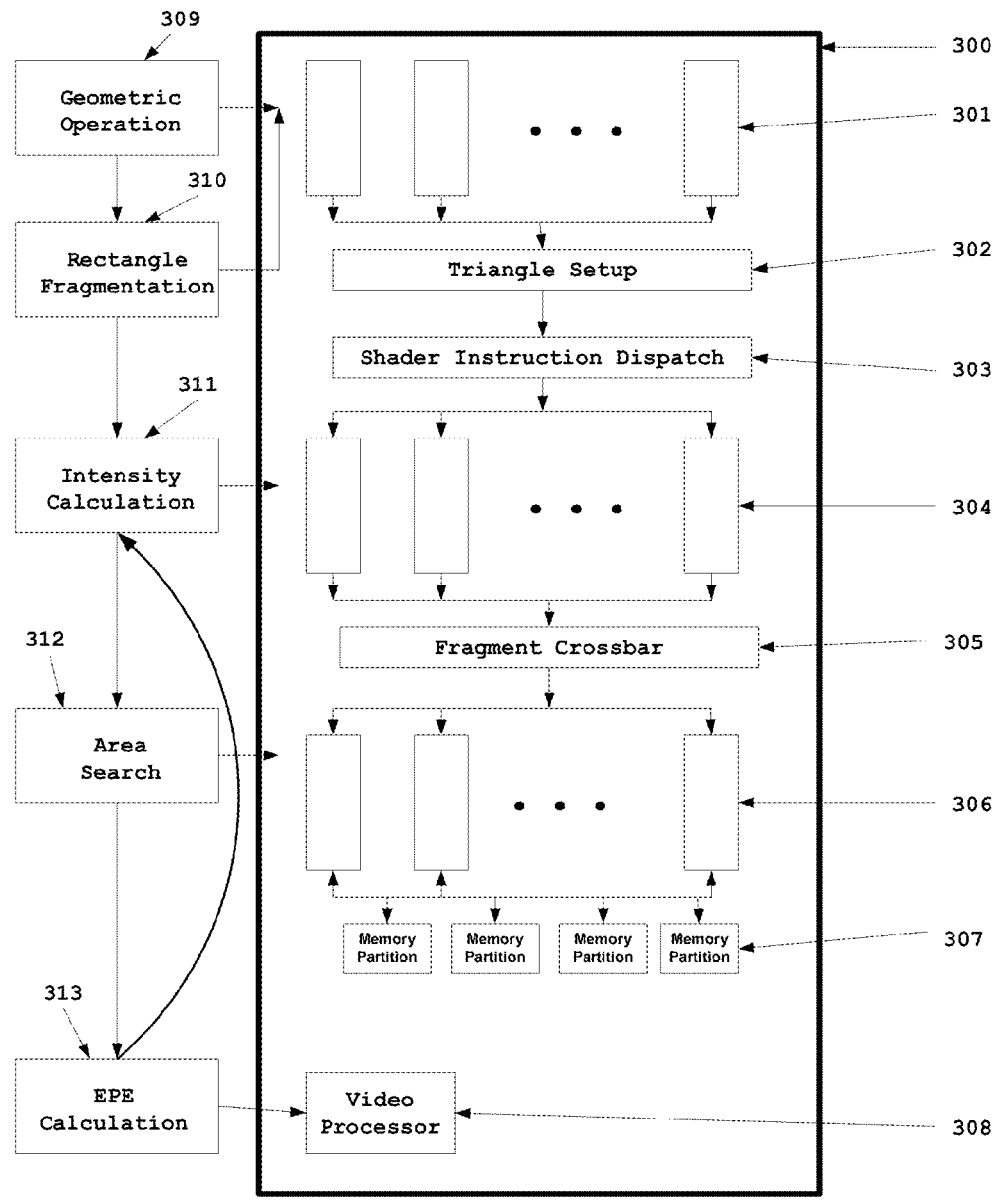
FIG. 1 is a schematic representation of a typical implementation for some OPC procedures on a typical commercial GPU.

FIG. 1 is a schematic representation of typical procedures for performing a typical OPC method on commercial GPU. The specific case illustrated uses an Nvidia GeForce® GPU processor, but the present invention may generally apply to any commercial GPU or similar device.

Various operations of an OPC flow are executed using a graphics processor 300. Some steps of an OPC flow include a geometric operation 309, rectangle fragmentation 310, intensity calculation 311, area search 312, and placement error or edge placement error (EPE) calculation 313. Geometric operations are. Rectangle fragmentation operations are. Intensity calculations are. Area search are. Placement error or EPE calculations are.

The graphics processor may be a single integrated circuit or multiple integrated circuits. For example, all the GPU components shown in the figure (e.g., blocks 301, 302, 303, 304, 305, 306, 307, and 308) may reside on a single integrated circuit. Or any combination of components may reside on one integrated circuit and other components reside on one or more other integrated circuits. Also a single integrated circuit may include one or more graphics processor cores.

In a graphics processor 300, there are one or more vertex processors 301, which are connected to a triangle setup block 302. A vertex processor is responsible for running the vertex shaders. The input for a vertex shader is the vertex data, namely its position, color, normals, an so forth. In a vertex shader, one can write code for tasks such as: vertex position transformation using the model view and projection matrices; normal transformation, and if required its normalization; texture coordinate generation and transformation; lighting per vertex or computing values for lighting per pixel; and color computation.

The triangle set up block does. The triangle set-up block is connected to a shader instruction dispatch 303. The shader instruction dispatch does. The shader instruction dispatch is connected to one or more fragment processors 304.

The fragment processor is where the fragment shaders run. This unit is responsible for operations like: computing colors, and texture coordinates per pixel; texture application; fog computation; and computing normals if one wants lighting per pixel. The inputs for a fragment processor this unit are typically the interpolated values computed in the previous stage of the pipeline such as vertex positions, colors, normals, and so forth.

The fragment processor is connected to a fragment crossbar 305. The fragment crossbar does. The fragment crossbar is connected to a stencil buffer 306. The stencil does. The stencil is connected to one or more memory partitions 307.

The graphics processor may have one or more video processors 308. The video processor does. The video processor is connected to. Any combination of the components shown in graphics processor 300 may included one integrated circuit. For example, a graphics processing unit integrated circuit may include a vertex processor unit and a fragment processor unit. The graphics processing unit integrated circuit may include a vertex shader unit and a stencil buffer unit.

Geometric operations may be performed in the CPU (outside the GPU), vertex processor, or fragment processor. Fragmentation operations may be performed in the CPU, vertex processor, or fragment processor. Intensity calculations may be performed in the fragment processor. Area search may be performed in the fragment processor or stencil. EPE calculations may be performed in the fragment processor or video processor. In OPC procedure, any combination of these operations may be performed with each other.

Figure 2:
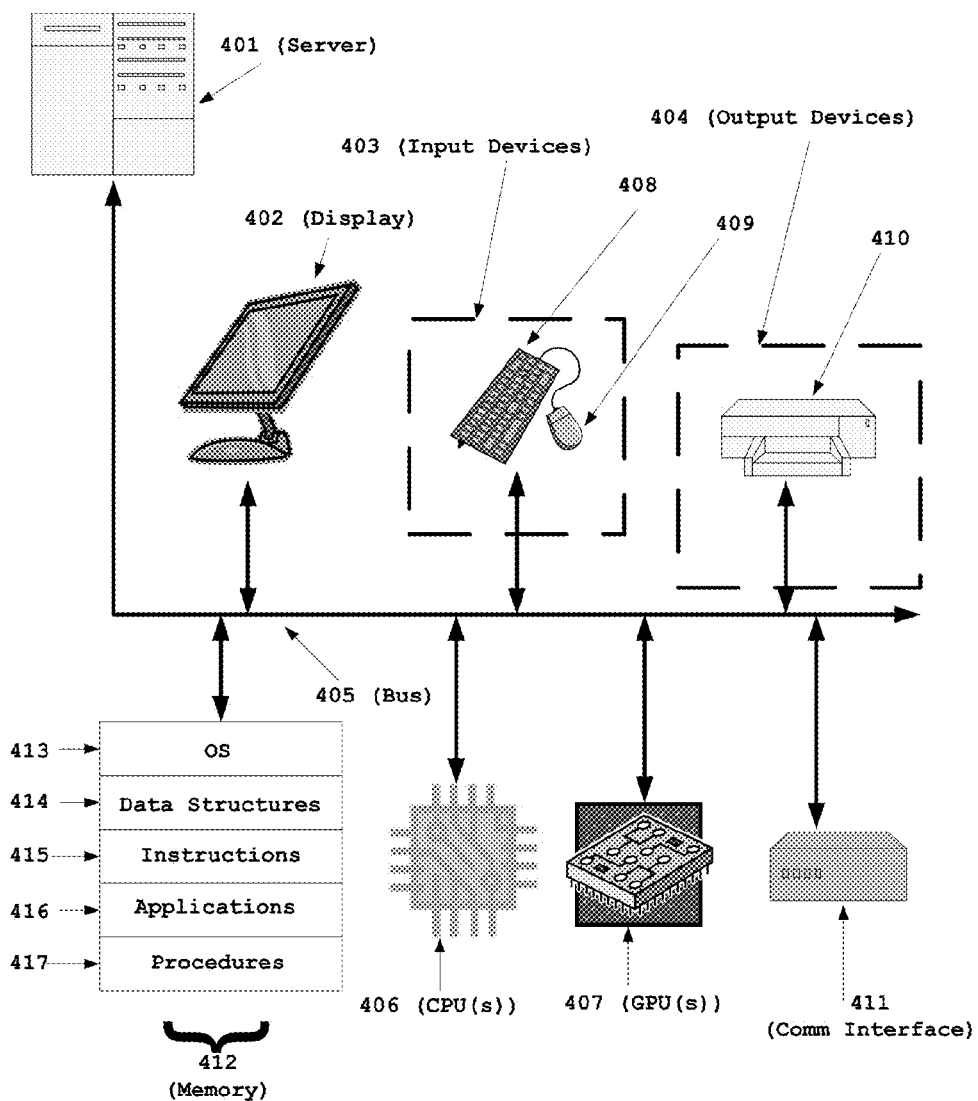
FIG. 2 depicts an illustrative computer system pertaining to various embodiments of the present invention.

FIG. 2 depicts an illustrative computer system pertaining to various embodiments of the present invention. In some embodiments, the computer system includes a server 401, display 402, one or more input interfaces 403, and one or more output interfaces 404, all conventionally coupled by one or more buses 405. Examples of suitable buses include PCI-Express®, AGP, PCI, ISA, and the like.

The computer system may include any number of graphics processors. The graphics processor may reside on the motherboard such as being integrated with the motherboard chipset. One or more graphics processors may reside on external boards connected to the system through a bus such as an ISA bus, PCI bus, AGP port, PCI Express, or other system buses. Graphics processors may on separate boards, each connected to a bus such as the PCI Express bus to each other and to the rest of the system. Further, there may be a separate bus or connection (e.g., Nvidia SLI or ATI CrossFire connection) by which the graphics processors may communicate with each other. This separate bus or connection may be used in addition to or in substitution for system bus.

The server 401 includes one or more CPUs 406, one or more GPUs 407, and one or more memory modules 412. Each CPU and GPU may be a single core or multiple core unit. Examples of suitable CPUs include Intel Pentium®, Intel Core™ 2 Duo, AMD Athlon 64, AMD Opteron®, and the like. Examples of suitable GPUs include Nvidia GeForce®, ATI Radeon®, and the like. The input interfaces 403 may include a keyboard 408 and a mouse 409. The output interface 404 may include a printer 410.

The communications interface 411 is a network interface that allows the computer system to communicate via a wireless or hardwired network. The communications interface 411, may be coupled to a transmission medium (not shown), such as a network transmission line, for example, twisted pair, coaxial cable, fiber optic cable, and the like. In another embodiment, the communications interface 411, provides a wireless interface, that is, the communication interface 411 uses a wireless transmission medium. Examples of other devices that may be used to access the computer system via communications interface 411 include cell phones, PDAs, personal computers, and the like (not shown).

The memory modules 412 generally include different modalities, illustratively semiconductor memory, such as random access memory (RAM), and disk drives as well as others. In various embodiments, the memory modules 412, store an operating system 413, data structures 414, instructions 415, applications 416, and procedures 417.

Storage devices may include mass disk drives, floppy disks, magnetic disks, optical disks, magneto-optical disks, fixed disks, hard disks, CD-ROMs, recordable CDs, DVDs, recordable DVDs (e.g., DVD-R, DVD+R, DVD-RW, DVD+RW, HD-DVD, or Blu-ray Disc), flash and other nonvolatile solid-state storage (e.g., USB flash drive), battery-backed-up volatile memory, tape storage, reader, and other similar media, and combinations of these.

In various embodiments, the specific software instructions, data structures, and data that implement various embodiments of the present invention are typically incorporated in the server, 401. Generally, an embodiment of the present invention is tangibly embodied using a computer readable medium, for example, the memory, and includes of instructions, applications, and procedures which, when executed by the processor, causes the computer system to utilize the present invention, for example, the collection and analysis of data, pixelating structures, determining edge placement errors, moving edge fragments, optimizing edge fragment placements, and the like. The memory may store the software instructions, data structures, and data for any of the operating system, the data collection application, the data aggregation application, the data analysis procedures, and the like in semiconductor memory, in disk memory, or a combination of these.

A computer-implemented or computer-executable version of the invention may be embodied using, stored on, or associated with computer-readable medium. A computer-readable medium may include any medium that participates in providing instructions to one or more processors for execution. Such a medium may take many forms including, but not limited to, nonvolatile, volatile, and transmission media. Nonvolatile media includes, for example, flash memory, or optical or magnetic disks. Volatile media includes static or dynamic memory, such as cache memory or RAM. Transmission media includes coaxial cables, copper wire, fiber optic lines, and wires arranged in a bus. Transmission media can also take the form of electromagnetic, radio frequency, acoustic, or light waves, such as those generated during radio wave and infrared data communications.

For example, a binary, machine-executable version, of the software of the present invention may be stored or reside in RAM or cache memory, or on a mass storage device. The source code of the software of the present invention may also be stored or reside on mass storage device (e.g., hard disk, magnetic disk, tape, or CD-ROM). As a further example, code of the invention may be transmitted via wires, radio waves, or through a network such as the Internet.

The operating system may be implemented by any conventional operating system comprising Windows® (registered trademark of Microsoft Corporation), Unix® (registered trademark of the Open Group in the United States and other countries), Mac OS® (registered trademark of Apple Computer, Inc.), Linux® (registered trademark of Linus Torvalds), as well as others not explicitly listed here.

In various embodiments, the present invention may be implemented as a method, system, or article of manufacture using standard programming or engineering techniques, or both, to produce software, firmware, hardware, or any combination thereof. The term "article of manufacture" (or alternatively, "computer program product") as used in this application is intended to encompass a computer program accessible from any computer readable device, carrier or media. In addition, the software in which various embodiments are implemented may be accessible through the transmission medium, for example, from a server over the network. The article of manufacture in which the code is implemented also encompasses transmission media, such as the network transmission line and wireless transmission media. Thus the article of manufacture also includes the medium in which the code is embedded. Those skilled in the art will recognize that many modifications may be made to this configuration without departing from the scope of the present invention.

The computer system illustrated in FIG. 2 is not intended to limit the present invention. Other alternative hardware environments may be used without departing from the scope of the present invention.

An approach of the invention is the replacement of computations with communication (memory access) since graphical processing units (GPUs) have better handling of arithmetic complexity than those based on random access.

For example, the nVidia 7900 series GPU, at its peak, can handle 24*2*(4-vector)=48*(4-vector) computations in one clock cycle. This is equivalent to 24 billion (or 24G) 4-component-operations (i.e., 96 Gflops). At the same time, the same GPU can access to the memory with a peak performance of 35 gigabytes per second access speed. Unfortunately, in the case of random texture accesses this number reduces to 4 gigabytes per second. In other words, in the random access case, one can perform (4 gigabytes/4 components/4 bytes per component=256 million 4-component-accesses. In other words, one can replace one random 4-component texel access with 196 4-vector computations. In this patent, we exploit this case.

Conversion of 2D Lookup Tables into Computations

In an implementation of the invention, there are three steps of converting a two-dimensional (2D) matrix memory lookup into computations in GPUs.

Figure 3:
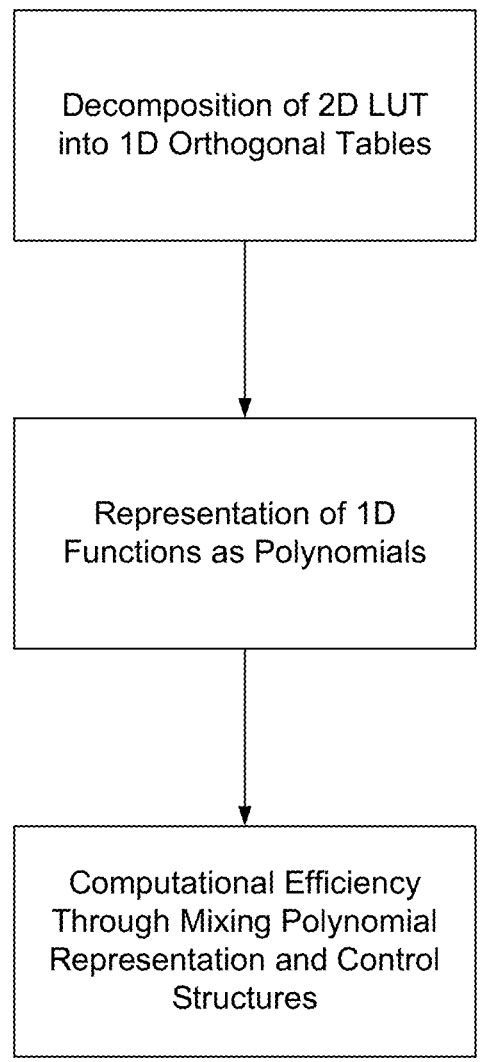
FIG. 3 shows a flow of the steps of converting a two-dimensional matrix memory lookup into computations in GPUs.

FIG. 3 shows a flow of the steps of converting a two-dimensional matrix memory lookup into computations in GPUs.

Step 1: Decomposition of 2D LUT into 1D Orthogonal Tables

Assume a 2D lookup table, h, which contains one complex number per entry. In the case of a GPU, it is two complex numbers, i.e., four entries. Any arbitrary 2D matrix can be decomposed into a sum of outer products of two one-dimensional (1D) orthogonal functions. This can be mathematically represented as h(n1, n2)=Sum(hk1 (n1)*hk2(n2)).

In general, a given 2D lookup table can be partitioned by using a singular value decomposition (SVD) technique.

The 2D lookup table that represents the sum, h, can be represented with $10^{-4}$ accuracy by using eight 1D tables. In other words, by performing sixteen table accesses (eight access per dimension) we can generate the same table, h. However, the penalty is, this approach requires sixteen times more accesses to the memory.

Further simplification can be performed in the case the 1D functions are symmetric or skew symmetric. These properties allow us to reduce the amount of data to be stored by half. Nevertheless, this operation does not reduce the lookup count.

Step 2: Representation of 1D Functions (H1k and H2k) as Polynomials

Each lookup operation can replaced with direct computation by representing each 1D function using a polynomial representation. In one embodiment, the 1D bases can be represented by 20-25$^{th}$ order polynomials. This way we can replace each lookup table with a twentieth degree polynomial computation. In this case, the twentieth degree polynomial with constant coefficients can be programmed into the fragment program a priori.

However, in this case, each 2D lookup has been replaced with 16 (8 per 1D function)*20=320 computations (multiply-add operation). Although there is no lookup in this case, it still requires considerable amount of computation.

When the hk1 and hk2 functions are either identical or the conjugate (reverse) of each other, we can further reduce computations by half. Therefore, the total required computations is 8*20=160.

Step 3: Computational Efficiency Through Mixing Polynomial Representation and Control Structures The computational cost can be reduced dividing domain of the hk1 or hk2 functions into subdomains such that in each domain, as shown below, the portion of the 1D function can be represented with lower degree polynomial. For example, by dividing the domain into 10 subregions, each 1D function can be represented with a third order (i.e., quadratic) polynomial.

By dividing the index space, n1 or n2, into equal intervals, we can approximate the hnk1 with a lower order polynomial. We can determine the interval in which the given n1 or n2 values lie by dividing the index by the interval length and by using a switching operation as outlined below. In this case, by using a say third-degree polynomial approximation, we reduce the calculation cost to four multiplications and a switching operation. The following is sample pseudocode:

IntervalLength=totalIntervalLength/10; // as an example
interval=n1/IntervalLength;
switch (interval)
case 1:
hnk1=((c3*x+c2)*x+c1)*x+c0;
break;
case 2:
hnk1=((c7*x+c6)*x+c5)*x+c4;
break;
. . .
}

In other words, the total cost can be reduced to 8*(4+1)=40 computations. Therefore, this computation is about five times faster than a computation employing memory lookup operations.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A system comprising:
   a computing system comprising at least one central processing unit and at least one graphics processing unit;
   a user interface for interacting with the computer system;
   a computer readable medium comprising data describing size and placement of features to be formed on a photolithography exposure mask used to manufacture semiconductor devices; and
   a computer readable medium comprising optical proximity correction calculation procedures for acting upon the data, wherein at least a portion of the optical proximity correction calculation procedures are executed using the graphics processing unit, and the optical proximity correction calculation procedures comprise:

causing processing of a set of polynomials in parallel using the graphics processing unit.

2. The system of claim 1 further comprising:

output devices for displaying the results of applying the optical proximity correction calculation procedures executed using the graphics processing unit upon the data, wherein X and Y coordinates for two opposite corners of a two-dimensional trapezoidal shape of the data is represented in a RGBA (RED-GREEN-BLUE-ALPHA) color space format in the graphics processing unit.

3. A method comprising:

providing a target mask, wherein the target mask is nonpixelated, quantized tone, and in a spatial domain;

performing a frequency domain transformation on the target mask to obtain a first mask, wherein the first mask is nonpixelated, continuous tone, and in a frequency domain; and using an electronic processor, computing a first cost function for a first mask to obtain a first value.

4. The method of claim 3 comprising:

altering the first mask in a frequency domain to obtain a second mask, wherein the second mask is nonpixelated, continuous tone, and in the frequency domain, wherein the altering comprises:

converting a matrix into a set of polynomials; and processing the set of polynomials using parallel computational hardware.

5. The method of claim 3 comprising:

computing the first cost function for the second mask to obtain a second value; and repeating the altering the first mask and the computing the first cost function for the second mask until the second value is less than the first value.

* * * * *